United States Patent
Nawata

(10) Patent No.: US 9,665,108 B2
(45) Date of Patent: May 30, 2017

(54) VIBRATION REDUCTION APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Ryo Nawata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 51 days.

(21) Appl. No.: 14/656,928

(22) Filed: Mar. 13, 2015

(65) Prior Publication Data

US 2015/0268566 A1    Sep. 24, 2015

(30) Foreign Application Priority Data

Mar. 18, 2014    (JP) ................. 2014-055615

(51) Int. Cl.
| | | |
|---|---|---|
| G03B 27/58 | (2006.01) | |
| G05D 19/02 | (2006.01) | |
| G05B 15/02 | (2006.01) | |
| G03F 7/20 | (2006.01) | |

(52) U.S. Cl.
CPC ............. *G05D 19/02* (2013.01); *G03F 7/709* (2013.01); *G05B 15/02* (2013.01)

(58) Field of Classification Search
CPC .... G05B 15/02; G05D 19/02; G03F 7/70766; G03F 7/709
See application file for complete search history.

(56) References Cited

U.S. PATENT DOCUMENTS

| | | | | |
|---|---|---|---|---|
| 5,823,307 A * | 10/1998 | Schubert | ................. | E04B 1/985 188/378 |
| 6,038,013 A * | 3/2000 | Ohsaki | ................ | G03F 7/70716 248/550 |
| 6,193,206 B1 * | 2/2001 | Yasuda | ................. | F16F 7/1005 188/378 |
| 6,378,672 B1 * | 4/2002 | Wakui | ................... | F16F 15/005 188/378 |
| 6,750,947 B1 * | 6/2004 | Tomita | ................... | G02B 7/026 355/52 |
| 9,304,404 B2 * | 4/2016 | Fischer | ............... | G03F 7/70825 |

(Continued)

FOREIGN PATENT DOCUMENTS

JP    2013190070 A    9/2013

*Primary Examiner* — Deoram Persaud
(74) *Attorney, Agent, or Firm* — Rossi, Kimms & McDowell LLP

(57) ABSTRACT

The present invention provides a vibration reduction apparatus which reduces a vibration of a target object supported on a base, comprising a first object supported by a first elastic member on the base, a second object supported by a second elastic member on the first object, a detection unit including a sensor having a first electrode provided on the first object and a second electrode provided on the second object, and a processor configured to obtain a distance between the first electrode and the second electrode using the sensor, a first driving unit configured to drive the first object, a first control unit configured to control the distance between the first electrode and the second electrode constant based on a detection result, wherein the second electrode and the processor are electrically connected to each other via the second elastic member.

19 Claims, 7 Drawing Sheets

(56) References Cited

U.S. PATENT DOCUMENTS

| | | | |
|---|---|---|---|
| 2006/0272910 A1* | 12/2006 | Kraner | F16F 15/027 188/266.7 |
| 2007/0035074 A1* | 2/2007 | Vervoordeldonk | B60G 13/16 267/140.11 |
| 2008/0068603 A1* | 3/2008 | Nawata | G03B 27/53 356/244 |
| 2008/0237947 A1* | 10/2008 | Warmerdam | B60G 17/0157 267/75 |
| 2008/0246200 A1* | 10/2008 | Varvoordeldonk | F16F 15/02 267/140.14 |
| 2009/0115422 A1* | 5/2009 | Matsumoto | H01L 21/68 324/457 |
| 2009/0164051 A1* | 6/2009 | Vervoordeldonk | G03F 7/709 700/302 |
| 2009/0201484 A1* | 8/2009 | Arai | B82Y 10/00 355/72 |
| 2009/0320593 A1* | 12/2009 | Nakashio | G01C 19/5663 73/504.15 |
| 2010/0321662 A1* | 12/2010 | Butler | G03F 7/70766 355/67 |
| 2011/0127400 A1* | 6/2011 | Kastelijn | F16F 15/02 248/550 |
| 2012/0105820 A1* | 5/2012 | Nawata | G03F 7/709 355/77 |
| 2013/0240705 A1 | 9/2013 | Asano | |
| 2015/0153659 A1* | 6/2015 | Nawata | G03F 7/709 355/72 |
| 2015/0369330 A1* | 12/2015 | Nawata | F16F 15/022 355/72 |

\* cited by examiner

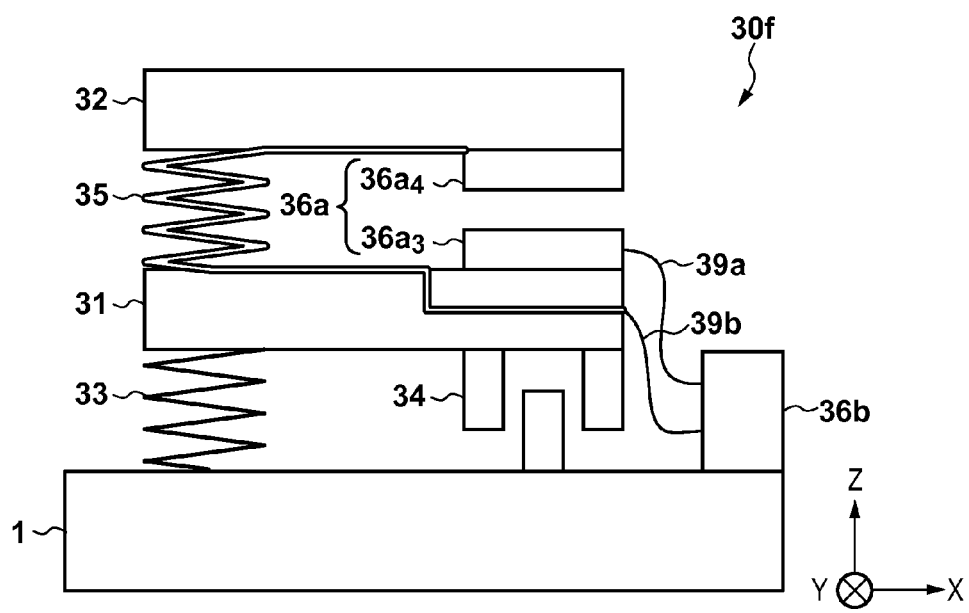
F I G. 11
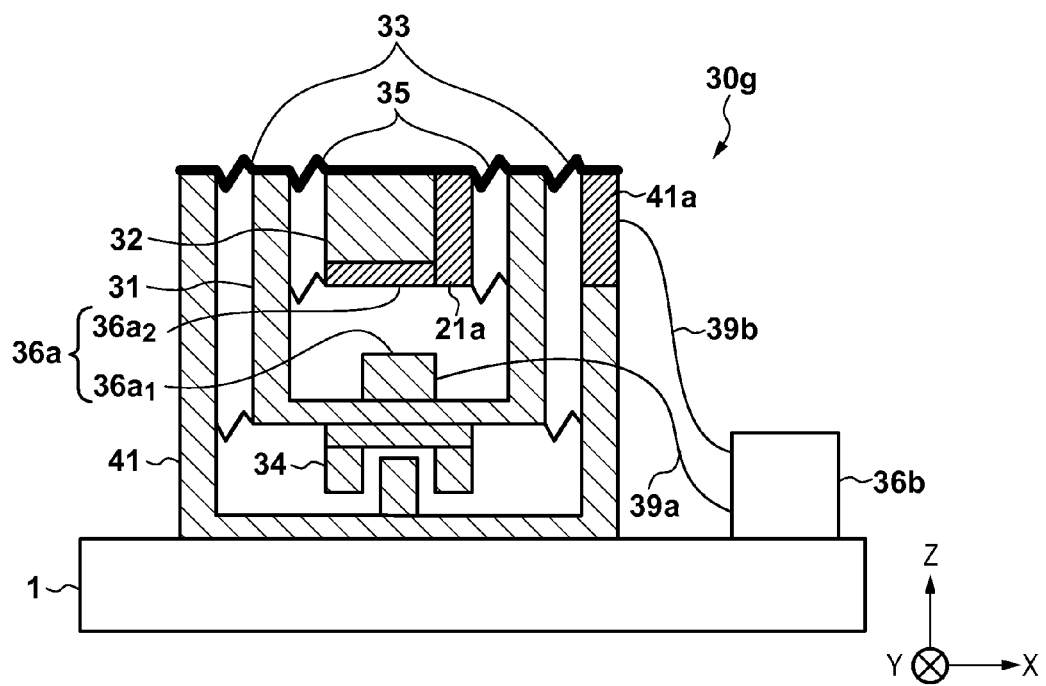
F I G. 12

VIBRATION REDUCTION APPARATUS, LITHOGRAPHY APPARATUS, AND METHOD OF MANUFACTURING ARTICLE

BACKGROUND OF THE INVENTION

Field of the Invention

The present invention relates to a vibration reduction apparatus, a lithography apparatus, and a method of manufacturing an article.

Description of the Related Art

In a lithography apparatus for forming a pattern on a substrate, the vibration transferred from the base to the main body of the lithography apparatus is a cause of degradation in overlay precision and transferring precision. For this reason, the lithography apparatus uses a vibration reduction apparatus for reducing the vibration of a target object such as a base plate on which the main body of the lithography apparatus is mounted.

Japanese Patent Laid-Open No. 2013-190070 has proposed a vibration reduction apparatus which reduces the vibration of a target object supported on the base by using an elastic member (for example, an air spring). The vibration reduction apparatus disclosed in Japanese Patent Laid-Open No. 2013-190070 includes an actuator which drives the target object and a reference system having a reference object. It is possible to reduce the vibration of the target object by performing feedback control on the actuator so as to make the relative distance between the target object and the reference object of the reference system constant.

The reference system of the vibration reduction apparatus disclosed in Japanese Patent Laid-Open No. 2013-190070 includes the first object supported on the base, the second object supported on the first object, a detection unit which detects the distance between the first object and the second object, and a driving unit which drives the first object. In the reference system, it is possible to reduce the vibration of the second object serving as the reference object by performing feedback control on the driving unit so as to make the distance detected by the detection unit constant.

In such a reference system, assume a case in which an electrostatic capacitance sensor, an eddy current displacement sensor, or the like is used as the detection unit to detect the distance between the first object and the second object. In this case, if a cable line itself connected to the second object vibrates, the second object also vibrates in response to this, thus making it difficult to reduce the vibration of the target object.

SUMMARY OF THE INVENTION

The present invention provides a technique advantageous in reducing, for example, the vibration of a target object supported on a base.

According to one aspect of the present invention, there is provided a vibration reduction apparatus which reduces a vibration of a target object supported on a base, the apparatus comprising: a first object supported by a first elastic member on the base; a second object supported by a second elastic member on the first object; a detection unit including a sensor having a first electrode provided on the first object and a second electrode provided on the second object, and a processor configured to obtain a distance between the first electrode and the second electrode using the sensor; a first driving unit arranged between the base and the first object, and configured to drive the first object; a first control unit configured to control the first driving unit so as to make the distance between the first electrode and the second electrode constant based on a detection result by the detection unit; a second driving unit arranged between the base and the target object, and configured to drive the target object; and a second control unit configured to control the second driving unit so as to make a distance between the target object and the second object constant, wherein the second electrode and the processor are electrically connected to each other via the second elastic member.

Further features of the present invention will become apparent from the following description of exemplary embodiments with reference to the attached drawings.

BRIEF DESCRIPTION OF THE DRAWINGS

FIG. 11 is a view showing an example of the arrangement of a reference system in the vibration reduction apparatus according to the second embodiment; and FIG. 12 is a view showing an example of the arrangement of a reference system in the vibration reduction apparatus according to the second embodiment.

DESCRIPTION OF THE EMBODIMENTS

Figure 1:
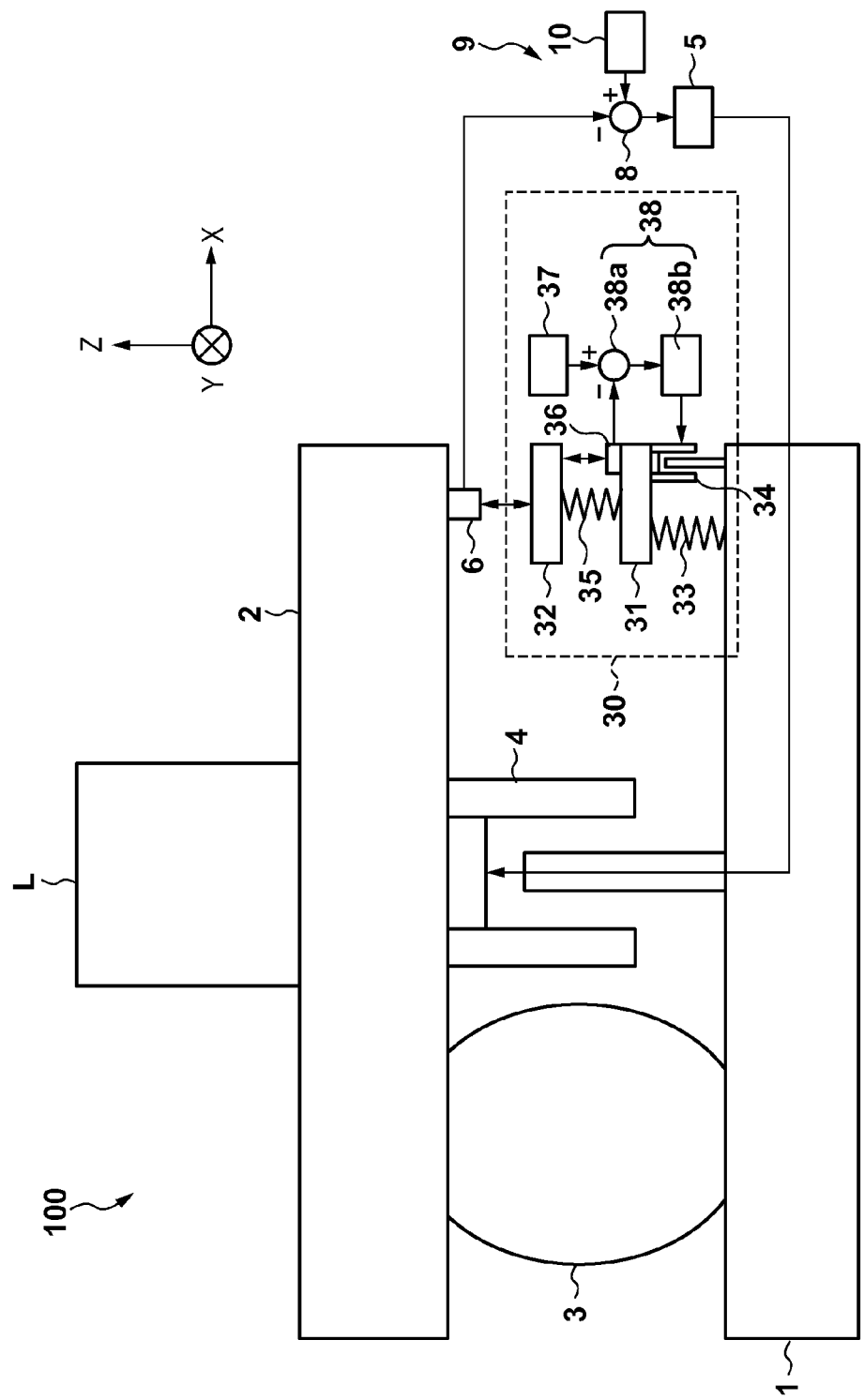
FIG. 1 is a schematic view showing the arrangement of a vibration reduction apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

A vibration reduction apparatus 100 according to the first embodiment of the present invention will be described with reference to FIG. 1. FIG. 1 is a schematic view showing the arrangement of the vibration reduction apparatus 100 according to the first embodiment. The vibration reduction apparatus 100 according to the first embodiment reduces the vibration of a target object 2 such as a base plate elastically supported on a base. The first embodiment will exemplify the vibration reduction apparatus 100 which reduces the vibration of the target object 2 in the vertical direction (Z direction). In this case, the vibration reduction apparatus 100 can also reduce the vibration of the target object 2 in the horizontal direction (X and Y directions) by applying the same arrangement as that for reducing the vibration of the target object 2 in the vertical direction to vibration in the horizontal direction.

The vibration reduction apparatus 100 according to the first embodiment is applied as, for example, a constituent element of a lithography apparatus which forms a pattern on a substrate. A unit L (the main body or part of the lithography apparatus) which forms a pattern on a substrate can be mounted on the target object 2. As a lithography apparatus, there is available an imprint apparatus which molds an imprint material on a substrate using a mold, a drawing apparatus which performs drawing on a substrate using a charged particle beam, a projection exposure apparatus which projects a mask pattern on a substrate, or the like. When using an imprint apparatus as a lithography apparatus, the unit L can include a holding unit (substrate holder or mold holder) which holds at least one of a substrate and a mold. When using a drawing apparatus as a lithography apparatus, the unit L can include an irradiation unit (barrel) which irradiates a substrate with a charged particle beam and a holding unit (substrate holder) which holds a substrate. When using a projection exposure apparatus as a lithography apparatus, the unit L can include a projection optical system (barrel) which projects a mask pattern on a substrate and a holding unit (mask holder or substrate holder) which holds at least one of a mask and a substrate.

The vibration reduction apparatus 100 can include a base 1, the target object 2 as a target whose vibration is to be reduced, an elastic member 3 which elastically supports the target object 2 on the base, a driving unit 4 (second driving unit) which drives the target object 2, and a reference system 30 having a second object 32 (reference object). The base 1 is fixed on a foundation portion (floor) of a place where the lithography apparatus is placed. The elastic member 3 includes, for example, a gas spring and elastically supports the target object 2 on the base. The driving unit 4 is arranged between the base 1 and the target object 2, and drives the target object 2 in the vertical direction (Z direction) by applying a force to the target object 2. As the driving unit 4, for example, an actuator such as a linear motor can be used. The reference system 30 includes the second object 32 serving as the reference object to be a reference for the position of the target object 2 when controlling the vibration of the target object 2. The arrangement of the reference system 30 will be described later.

The vibration reduction apparatus 100 also includes a detection unit 6 and a control unit 9 (second control unit). The detection unit 6 detects the distance (to be referred to as the second distance hereinafter) between the target object 2 and the second object 32 and outputs a signal corresponding to the detected second distance. The detection unit 6 includes, for example, a laser interferometer, and is provided on the target object 2, as shown in FIG. 1. The detection unit 6 obtains the second distance by measuring the distance to the second object 32 of the reference system 30. Referring to FIG. 1, the detection unit 6 is provided on the target object 2. However, the detection unit 6 may be provided on the second object 32 and obtain the second distance by measuring the distance to the target object 2. The control unit 9 performs feedback control on the driving unit 4 (second driving unit) so as to make the second distance detected by the detection unit 6 constant, that is, make the second distance approach a target distance 10. The control unit 9 can include, for example, a subtractor 8 and a compensator 5.

The subtractor 8 calculates the deviation between the target distance 10 and the second distance detected by the detection unit 6. The compensator 5 outputs a control signal for controlling the driving unit 4 so as to reduce the deviation (toward 0) calculated by the subtractor 8. The control signal output from the compensator 5 is supplied to the driving unit 4. The driving unit 4 then drives the target object 2 by a drive amount corresponding to the control signal. When the driving unit 4 includes a linear motor, a current corresponding to the control signal is supplied to the coil of the linear motor to make the linear motor drive the target object 2. With this arrangement of the detection unit 6 and the control system 9, the vibration reduction apparatus 100 can perform feedback control on the position of the target object 2 with reference to the second object 32 of the reference system 30 and reduce the vibration generated in the target object 2.

The arrangement of the reference system 30 according to the first embodiment will now be described. The reference system 30 can include a first object 31, the second object 32 (reference object), a first elastic member 33, a driving unit 34 (first driving unit), a second elastic member 35, a detection unit 36, and a control unit 38, as shown in FIG. 1. The first elastic member 33 elastically supports the first object 31 on the base. Additionally, the second elastic member 35 elastically supports the second object 32 on the first object 31. As the first elastic member 33 and the second elastic member 35, for example, gas springs or coil springs can be used. The driving unit 34 is arranged between the base 1 and the first object 31, and drives the first object 31 to change the distance between the base 1 and the first object 31. The driving unit 34 includes, for example, an actuator (for example, a linear motor) which drives the first object 31 in the vertical direction (Z direction) by applying a force to the first object 31.

The detection unit 36 can include a sensor 36a having the first electrode provided on the first object 31 and the second electrode provided on the second object 32, and a processor 36b which obtains the distance (to be referred to as the first distance hereinafter) between the first electrode and the second electrode using the sensor 36a. For the sake of the simplicity of the arrangement of the reference system 30, FIG. 1 only shows the sensor 36a as the detection unit 36. The control unit 38 includes, for example, a subtractor 38a and a compensator 38b, and performs feedback control on the driving unit 34 (first driving unit) so as to make the first distance constant, that is, make the first distance approach a target distance 37 based on a detection result by the detection unit 36 (a signal from the processor 36b). The subtractor 38a calculates the deviation between the target distance 37 and the first distance detected by the detection unit 36. In addition, the compensator 38b is, for example, a PID compensator, and outputs a control signal for controlling the driving unit 34 so as to reduce (toward 0) the deviation calculated by the subtractor 38a.

The natural frequency of each system (each of the first to third systems) including one object and one elastic member in the vibration reduction apparatus 100 having the above-described arrangement will be described here. In the following description, the first system includes the first object 31 and the first elastic member 33, the second system includes the second object 32 and the second elastic member 35, and the third system includes the target object 2 and the elastic member 3. When an air spring is used as the elastic member 3 of the third system, the natural frequency of the third system falls within a range of about, for example, 3 Hz to 5 Hz. In this case, The natural frequency of each of the first system and the second system may be lower than that of the third system. In order to achieve this, for example, the mass of each of the first object 31 and the second object 32 is increased or the stiffness of each of the first elastic member 33 and the second elastic member 35 is reduced. However, increasing the mass of each of the first object 31 and the second object 32 results in a disadvantage in terms of a space where the first object 31 and the second object 32 are arranged, and reducing the stiffness of each of the first elastic member 33 and the second elastic member 35 results in a disadvantage in terms of a manufacturing limitation and a manufacturing cost. To solve this, the vibration reduction apparatus 100 according to the first embodiment is configured such that the natural frequency of each of the first system and the second system is higher than that of the third system. The vibration of the second object 32 is reduced by providing the detection unit 36, the driving unit 34, and the control unit 38 in the reference system 30 and performing feedback control on the driving unit 34 so as to make the first distance approach the target distance 37. This allows the vibration reduction apparatus 100 according to the first embodiment to reduce the vibration of the target object 2 with reference to the position of the second object 32 in the reference system 30. Note that the natural frequency of each of the first system and the second system in the first embodiment falls within a range of 5 Hz to 10 Hz.

Figure 2:
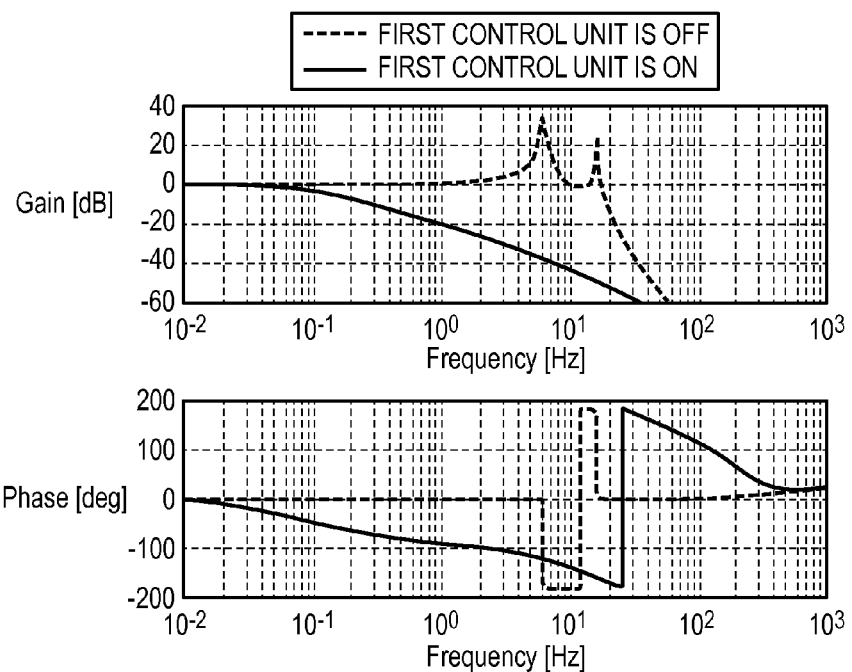
FIG. 2 shows graphs of a transfer function from a base to the second object.

FIG. 2 shows graphs of a transfer function from the base 1 to the second object 32 in the vibration reduction apparatus 100 according to the first embodiment. FIG. 2 shows gain characteristics and phase characteristics. Referring to FIG. 2, the broken line indicates the transfer function in a state in which the control unit 38 is not activated (the first control unit is OFF), and the solid line indicates the transfer function in a state in which the control unit 38 is activated (the first control unit is ON). As shown in FIG. 2, the vibration reduction apparatus 100 can greatly reduce the vibration transferred from the base 1 to the second object 32 in the frequency range of 0.1 Hz or more by providing the detection unit 36, the driving unit 34, and the control unit 38 in the reference system 30, and activating them.

Figure 3:
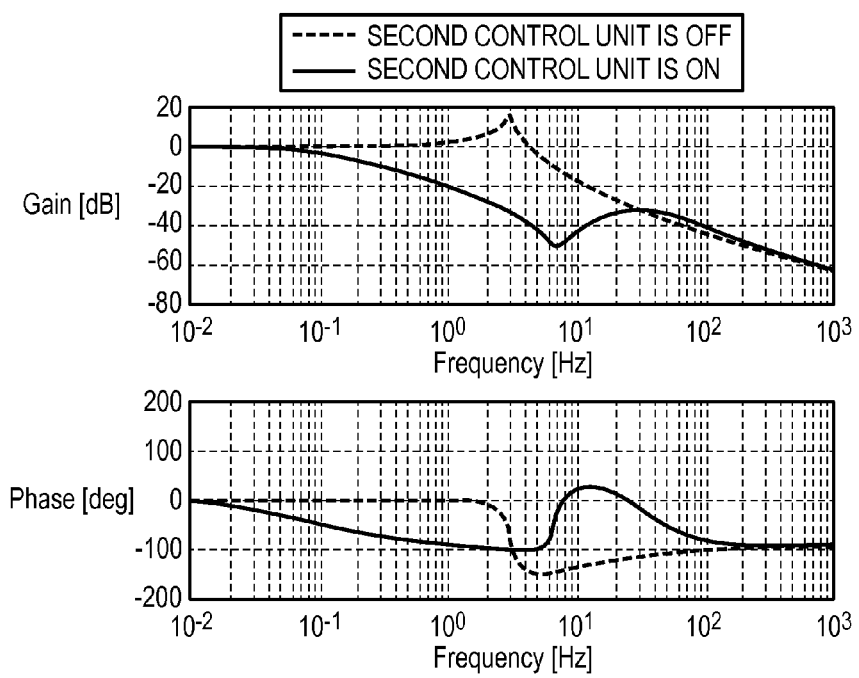
FIG. 3 shows graphs of a transfer function from the base to a target object.

The vibration reduction apparatus 100 can reduce the vibration generated in the target object 2 by performing feedback control on the position of the target object 2 with reference to the position of the second object 32 using the reference system 30 configured to reduce the vibration transferred from the base 1 to the second object 32. FIG. 3 shows graphs of a transfer function from the base 1 to the target object 2 in the vibration reduction apparatus 100 according to the first embodiment. FIG. 3 shows gain characteristics and phase characteristics. Referring to FIG. 3, the broken line indicates the transfer function in a state in which the control unit 9 is not activated (the second control unit is OFF), and the solid line indicates the transfer function in a state in which the control unit 9 is activated (the second control unit is ON). As shown in FIG. 3, the vibration reduction apparatus 100 can greatly reduce the vibration transferred from the base 1 to the target object 2 in the frequency range of 0.1 Hz to 30 Hz by activating the control unit 9.

Figure 4:
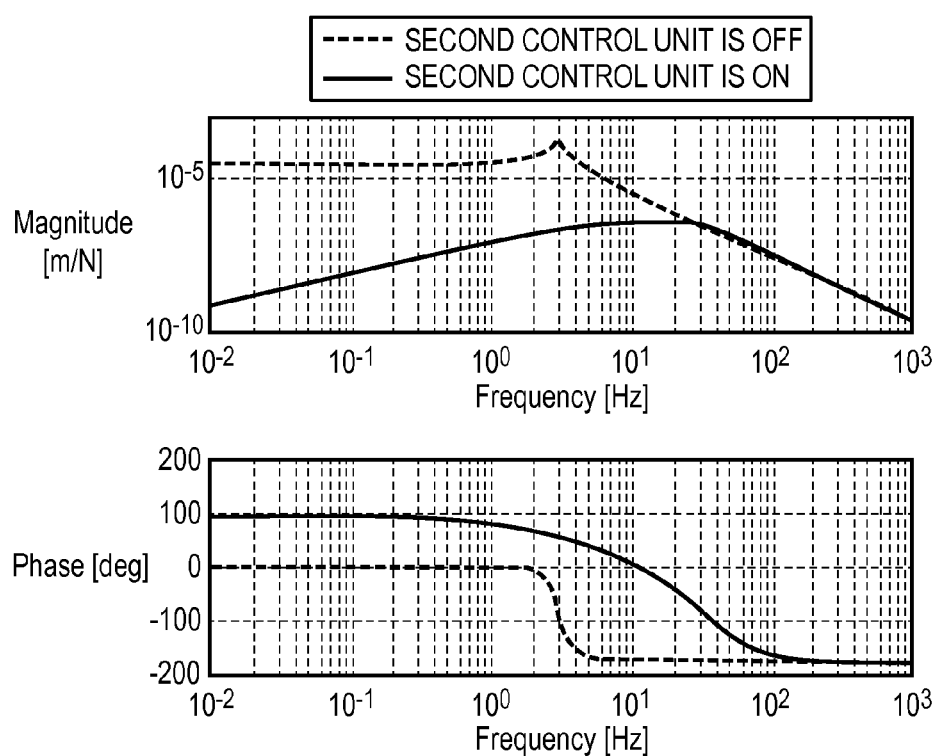
FIG. 4 shows graphs of the transfer function of the compliance of the target object.

FIG. 4 shows graphs of the transfer function of the compliance of the target object 2 in the vibration reduction apparatus 100 according to the first embodiment. The compliance of the target object 2 is the value obtained by dividing the displacement of the target object 2 by the disturbance applied to the target object 2, that is, the reciprocal of stiffness. The disturbance here can include, for example, a force externally applied to the target object 2 such as the vibration generated in the unit L mounted on the target object 2. FIG. 4, shows compliance characteristics and phase characteristics. Referring to FIG. 4, the broken line indicates the transfer function in a state in which the control unit 9 is not activated (the second control unit is OFF), and the solid line indicates the transfer function in a state in which the control unit 9 is activated (the second control unit is ON). As shown in FIG. 4, the vibration reduction apparatus 100 can greatly reduce the vibration generated on the target object 2 in the frequency range of 30 Hz or less by activating the control unit 9.

As described above, in the vibration reduction apparatus 100, a vibration may not be generated in the second object 32 of the reference system 30 as a reference for the position of the target object 2 when performing feedback control on the position. Therefore, in the reference system 30, feedback control is performed on the driving unit 34 so as to make the first distance detected by the detection unit 36 approach the target distance 37, thereby reducing the vibration of the second object 32. The detection unit 36 of the reference system 30 can include the sensor 36a having the first electrode and the second electrode, and the processor 36b which obtains the distance between the first electrode and the second electrode using the sensor 36a, as described above. In general, a first cable line 39a electrically connects the first electrode and the processor 36b, and a second cable line 39b electrically connects the second electrode and the processor 36b. At this time, for example, the processor 36b is placed on the base 1. If the vibration of the base 1 is transferred to the second cable line 39b via the processor 36b, the second cable line 39b itself vibrates and the second object 32 also vibrates in response to this. As a result, it would be difficult to reduce the vibration of the target object 2.

Figure 5:
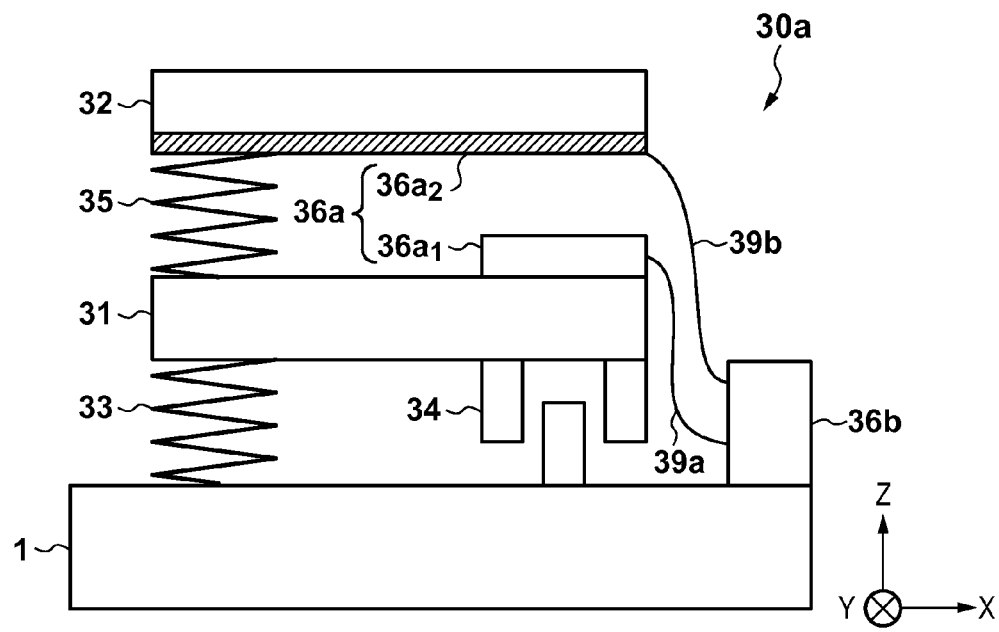
FIG. 5 is a view showing an example of the arrangement of a conventional reference system.

FIG. 5 is a view showing an example of the arrangement of a conventional reference system 30a. An example in which, for example, an electrostatic capacitance sensor including a probe $36a_1$ having the first electrode and provided on the first object 31, and an electrically conductive film $36a_2$ serving as the second electrode and provided on the surface of the second object 32 on the first object side is used as the sensor 36a of the detection unit 36 will be described here. The electrostatic capacitance sensor is used because it has an advantage of being able to make the reference system 30a smaller than an optical displacement sensor and having a lower cost as compared with the optical displacement sensor. The first cable line 39a connects the first electrode of the probe $36a_1$ and the processor 36b, and the second cable line 39b connects the electrically conductive film $36a_2$ serving as the second electrode and the processor 36b. The processor 36b can obtain the first distance based on a signal from the first electrode (for example, the potential of the first electrode) obtained via the first cable line 39a and a signal from the second electrode (for example, the potential of the second electrode) obtained via the second cable line 39b. Each of the first cable line 39a and the second cable line 39b can be a cable line having as low stiffness as possible as compared with those of the first elastic member 33 and the second elastic member 35, and can be wired to have an enough bendability.

In the conventional reference system 30a, the second cable line 39b connected to the second electrode (electrically conductive film $36a_2$) is connected to, for example, a terminal (for example, a ground terminal) provided in the processor 36b on the base directly, that is, via nowhere, as shown in FIG. 5. Also, the second cable line 39b is directly connected to a terminal provided on the base 1. In the reference system 30a having this arrangement, the vibration of the base 1 is transferred to the second cable line 39b, thereby vibrating the second cable line 39b. Furthermore, if the second cable line 39b vibrates, the second object 32 having high sensitivity to a disturbance may vibrate in response to this. To prevent this, in the vibration reduction apparatus 100 according to the first embodiment, the reference system 30 is configured so as to reduce transfer of the vibration of the second cable line 39b connected to the second electrode to the second object 32. An example of the arrangement of the reference system 30 according to the first embodiment will be described below. In the example of the arrangement of the reference system 30 to be described below, a case in which the second cable line 39b is connected to the terminal provided in the processor 36b will be described. However, the present invention is not limited to this. The second cable line 39b may be connected to a terminal provided on, for example, a floor where the base 1 and the lithography apparatus are placed.

EXAMPLE 1

Figure 6:
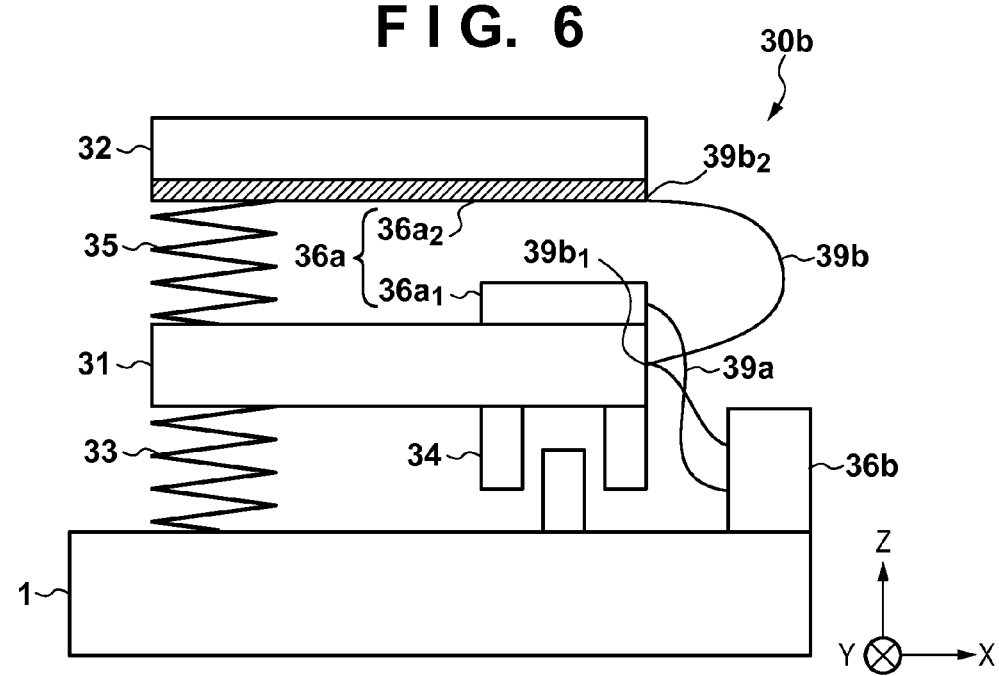
FIG. 6 is a view showing an example of the arrangement of a reference system in the vibration reduction apparatus according to the first embodiment.

FIG. 6 is a view showing an example of the arrangement of a reference system 30b in the vibration reduction apparatus 100 according to the first embodiment. Example 1 will describe an example in which, for example, the electrostatic capacitance sensor including the probe $36a_1$ having the first electrode and provided on the first object 31, and the electrically conductive film $36a_2$ serving as the second electrode and provided on the surface of the second object 32 on the first object side is used as the sensor 36a of the detection unit 36. In the example of the arrangement shown in FIG. 6, the second cable line 39b connected to the second electrode includes a fixing portion $39b_1$ fixed on the first object 31 without being electrically connected to the first object 31. At this time, the second cable line 39b is fixed on the first object 31 such that the length between a connecting portion $39b_2$ connected to the second electrode and the fixing portion $39b_1$ fixed on the first object 31 is longer than the distance between the first object 31 and the second object 32. That is, the second cable line 39b is fixed on the first object 31 to warp in a region between the connecting portion $39b_2$ and the fixing portion $39b_1$. With this arrangement of the reference system 30b, the fixing portion $39b_1$ fixed on the first object 31 can reduce transfer of the vibration of the second cable line 39b to the second object 32 even if the vibration of the base 1 is transferred to the second cable line 39b.

In Example 1, the electrostatic capacitance sensor is used as the sensor 36a of the detection unit 36 in the reference system 30b. However, the present invention is not limited to this. For example, an eddy current displacement sensor may be used. An example of a method of fixing the fixing portion $39b_1$ of the second cable line 39b on the first object 31 is a method using a fastener. This method can fix the fixing portion $39b_1$ of the second cable line 39b on the first object 31 by sandwiching the fixing portion $39b_1$ of the second cable line 39b between the fastener and the first object 31, and fixing the fastener on the first object 31 using a screw or the like. A method of fixing the fixing portion $39b_1$ of the second cable line 39b on the first object 31 using an adhesive material is also available.

Figure 7:
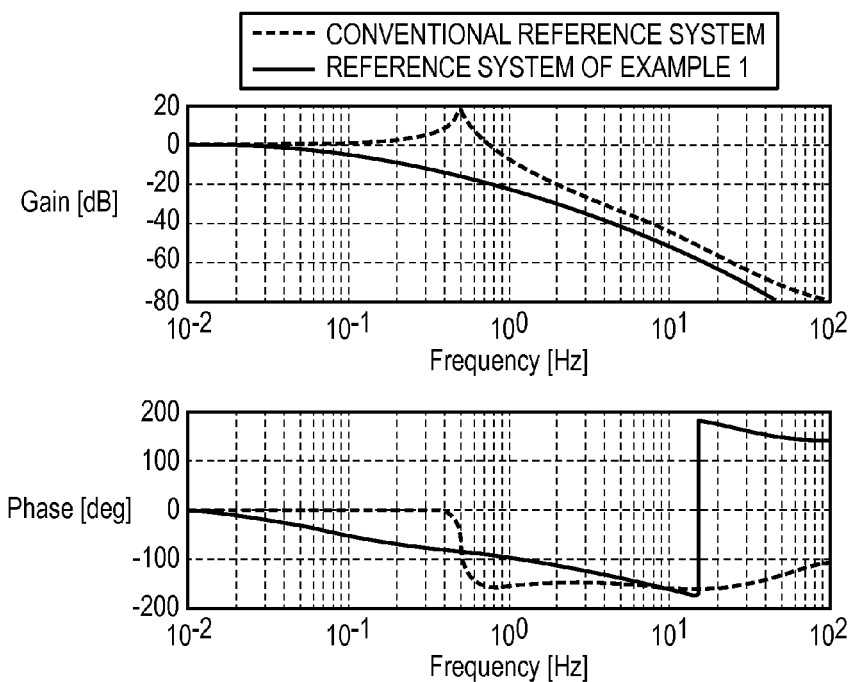
FIG. 7 shows graphs of the transfer function from the base to the second object.

FIG. 7 shows graphs of a transfer function from the base 1 to the second object 32. FIG. 7 shows gain characteristics and phase characteristics. Referring to FIG. 7, the broken line indicates the transfer function in the conventional reference system 30a (FIG. 5) where the second cable line 39b is not fixed on the first object 31, and the solid line indicates the transfer function in the reference system 30b (FIG. 6) of Example 1. As shown in FIG. 7, the reference system 30b of Example 1 can reduce the vibration transferred from the base 1 to the second object 32 in the frequency range of 0.1 Hz or more as compared with the conventional reference system 30a.

EXAMPLE 2

Figure 8:
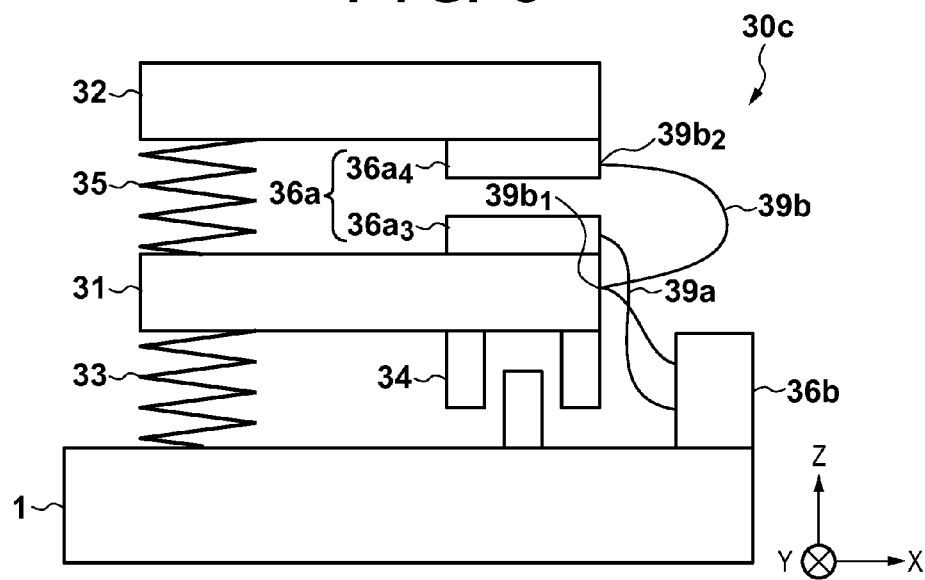
FIG. 8 is a view showing an example of the arrangement of a reference system in the vibration reduction apparatus according to the first embodiment.

FIG. 8 is a view showing an example of the arrangement of a reference system 30c in the vibration reduction apparatus 100 according to the first embodiment. Example 2 will describe an example in which, for example, an electrostatic capacitance sensor including a first probe $36a_3$ having the first electrode and provided on the first object 31, and a second probe $36a_4$ having the second electrode and provided on the second object 32 is used as the sensor 36a of the detection unit 36. The first cable line 39a connects the first electrode of the first probe $36a_3$ and the processor 36b, and the second cable line 39b connects the second electrode of the second probe $36a_4$ and the processor 36b. The second cable line 39b includes the fixing portion $39b_1$ fixed on the first object 31 without being electrically connected to the first object 31. At this time, the second cable line 39b is fixed on the first object 31 such that the length between the connecting portion $39b_2$ connected to the second electrode and the fixing portion $39b_1$ fixed on the first object 31 is longer than the distance between the first object 31 and the second object 32, as in Example 1. That is, the second cable line 39b may be fixed on the first object 31 to warp in the region between the connecting portion $39b_2$ and the fixing portion $39b_1$. With this arrangement of the reference system 30c, the fixing portion $39b_1$ fixed on the first object 31 can reduce transfer of the vibration of the second cable line 39b to the second object 32 even if the vibration of the base 1 is transferred to the second cable line 39b.

Second Embodiment

A vibration reduction apparatus according to the second embodiment will be described. The vibration reduction apparatus according to the second embodiment is the same as the vibration reduction apparatus 100 according to the first embodiment except for the arrangement of a reference system 30. Therefore, a description of the arrangements other than that of the reference system 30 will be omitted. In the vibration reduction apparatus according to the second embodiment, the reference system 30 is configured such that the second electrode provided on a second object 32 and a processor 36b of a detection unit 36 are electrically connected to each other without connecting a second cable line 39b to the second electrode. An example of the arrangement of the reference system 30 in the second embodiment will be described below.

EXAMPLE 3

Figure 9:
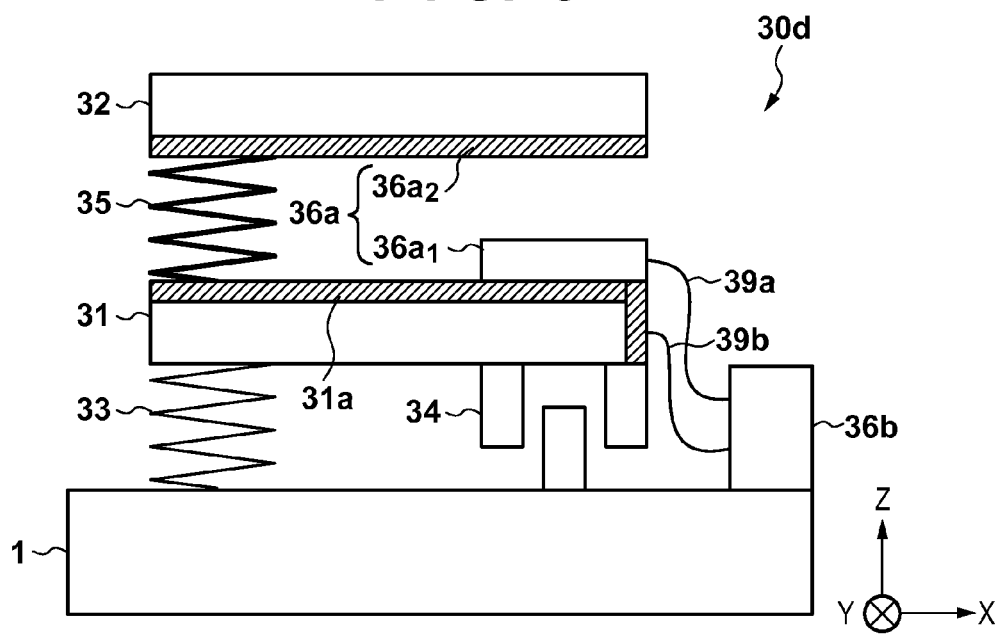
FIG. 9 is a view showing an example of the arrangement of a reference system in a vibration reduction apparatus according to the second embodiment.

FIG. 9 is a view showing an example of the arrangement of a reference system 30d in the vibration reduction apparatus according to the second embodiment. Example 3 will describe an example in which, for example, an electrostatic capacitance sensor including a probe $36a_1$ having the first electrode and provided on a first object 31, and an electrically conductive film $36a_2$ serving as the second electrode and provided on the surface of the second object 32 on the first object side is used as a sensor 36a of the detection unit 36. A first cable line 39a connects the first electrode of the probe $36a_1$ and a processor $36b$. The processor $36b$ obtains a signal from the first electrode (for example, the potential of the first electrode) via the first cable line $39a$. The electrically conductive film $36a_2$ serving as the second electrode is electrically connected to a second elastic member $35$ made of an electrically conductive material. The processor $36b$ obtains a signal from the second electrode (for example, the potential of the second electrode) via the second elastic member $35$. In the example shown in FIG. 9, an electrically conductive member $31a$ (for example, an electrically conductive film) is provided on a part of the first object $31$, and the processor $36b$ obtains a signal from the second electrode via the second elastic member $35$, the electrically conductive member $31a$, and a second cable line $39b$ connected to the processor $36b$. The electrically conductive member $31a$ provided on the part of the first object $31$ and the first electrode of the probe $36a_1$ are not electrically connected to each other. With this arrangement of the reference system $30d$, it is possible to reduce transfer of the vibration of the second cable line $39b$ to the second object $32$ in the same manner as a conventional reference system $30a$.

In Example 3, the electrostatic capacitance sensor is used as the sensor $36a$ of the detection unit $36$ in the reference system $30d$. However, the present invention is not limited to this. For example, an eddy current displacement sensor may be used. Also, as described in Example 2, for example, an electrostatic capacitance sensor including a first probe $36a_3$ having the first electrode and a second probe $36a_4$ having the second electrode may be used as the sensor $36a$ of the detection unit $36$. In this case, the second electrode of the second probe $36a_4$ is electrically connected to the second elastic member $35$ via the electrically conductive member provided on the part of the second object $32$.

EXAMPLE 4

Figure 10:
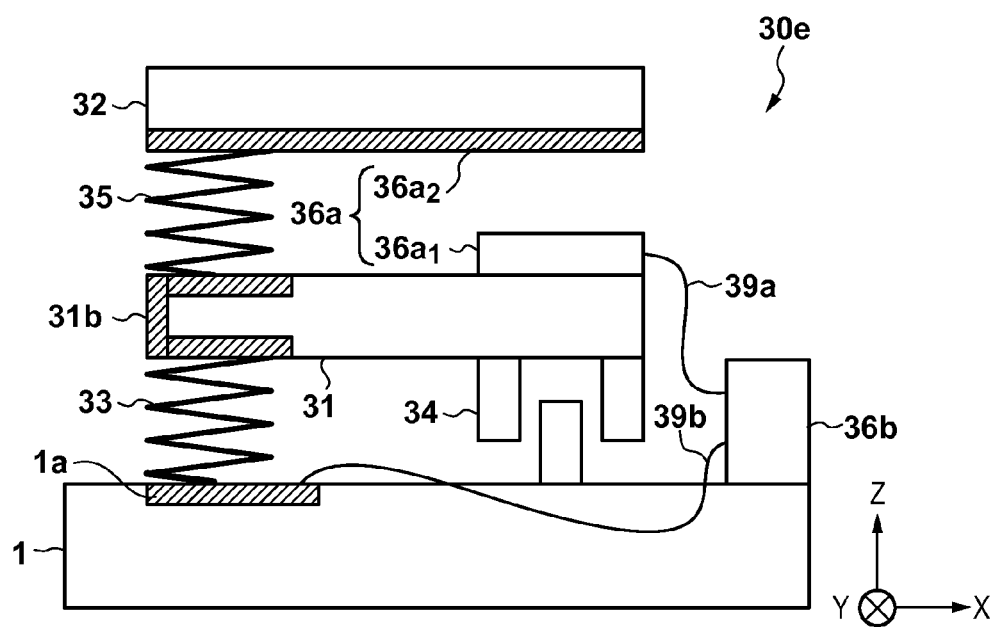
FIG. 10 is a view showing an example of the arrangement of a reference system in the vibration reduction apparatus according to the second embodiment.

FIG. 10 is a view showing an example of the arrangement of a reference system $30e$ in the vibration reduction apparatus according to the second embodiment. In the reference system $30e$ of Example 4, unlike the reference system $30d$ of Example 3, a first elastic member $33$ is also made of an electrically conductive material. The first elastic member $33$ and the second elastic member $35$ are electrically connected to each other via an electrically conductive member $31b$ (for example, an electrically conductive film) provided on the part of the first object $31$. The processor $36b$ obtains a signal from the second electrode via the second elastic member $35$, the electrically conductive member $31b$, and the first elastic member $33$. In the example shown in FIG. 10, an electrically conductive member $1a$ (for example, an electrically conductive film) is also provided on a part of a base $1$, and the processor $36b$ obtains a signal from the second electrode via the second elastic member $35$, the electrically conductive member $31b$, the first elastic member $33$, the electrically conductive member $1a$, and the second cable line $39b$ connected to the processor $36b$. With this arrangement of the reference system $30e$, it is possible to reduce transfer of the vibration of the second cable line $39b$ to the second object $32$ in the same manner as the conventional reference system $30a$.

EXAMPLE 5

FIG. 11 is a view showing an example of the arrangement of a reference system $30f$ in the vibration reduction apparatus according to the second embodiment. Example 5 will describe an example in which, for example, the electrostatic capacitance sensor including the probe $36a_3$ having the first electrode and provided on a first object $31$, and the second probe $36a_4$ having the second electrode and provided on the second object $32$ is used as a sensor $36a$ of the detection unit $36$. The first cable line $39a$ connects the first electrode of the probe $36a_3$ and a processor $36b$. The processor $36b$ obtains the signal from the first electrode via the first cable line $39a$. One terminal of the second elastic member $35$ made of the electrically conductive member is electrically connected to the second electrode of the second probe $36a_4$. The other terminal of the second elastic member $35$ is connected to the processor $36b$ via the second cable line $39b$. The processor $36b$ obtains a signal from the second electrode via the second elastic member $35$ and the second probe $36a_4$. With this arrangement of the reference system $30f$, it is possible to reduce transfer of the vibration of the second cable line $39b$ to the second object $32$ in the same manner as the conventional reference system $30a$.

EXAMPLE 6

FIG. 12 is a view showing an example of the arrangement of a reference system $30g$ in the vibration reduction apparatus according to the second embodiment. The reference system $30g$ of Example 6 can include the second object $32$ serving as a reference object, the first object $31$ arranged to surround the second object $32$, and a third object $41$ arranged to surround the first object $31$. The base $1$ supports the third object $41$. A driving unit $34$ which drives the first object $31$ is arranged between the first object $31$ and the third object $41$. The sensor $36a$ of the detection unit $36$ which detects the distance (first distance) between the first object $31$ and the second object $32$ is arranged between the first object $31$ and the second object $32$. Example 6 will describe an example in which, for example, the electrostatic capacitance sensor including the probe $36a_1$ having the first electrode and provided on the first object $31$, and the electrically conductive film $36a_2$ serving as the second electrode and provided on the surface of the second object $32$ on the first object side is used as the sensor $36a$ of the detection unit $36$. The first elastic member $33$ which elastically supports the first object $31$ with respect to the third object $41$ and the second elastic member $35$ which elastically supports the second object $32$ with respect to the first object $31$ are each made of an electrically conductive member, and are electrically connected to each other.

The first cable line $39a$ connects the first electrode of the probe $36a_1$ and the processor $36b$. The processor $36b$ obtains the signal from the first electrode via the first cable line $39a$. An electrically conductive member $21a$ (for example, an electrically conductive film) provided on the side surface of the second object $32$ electrically connects the electrically conductive film $36a_2$ serving as the second electrode to the second elastic member $35$. The processor $36b$ obtains a signal from the second electrode via the first elastic member $33$ and the second elastic member $35$ electrically connected to each other. In the example shown in FIG. 12, an electrically conductive member $41a$ (for example, an electrically conductive film) is also provided on a part of the third object $41$, and the processor $36b$ obtains a signal from the second electrode via the second elastic member $35$, the first elastic member $33$, the electrically conductive member $41a$, and the second cable line $39b$ connected to the processor $36b$. With this arrangement of the reference system $30g$, it is possible to reduce transfer of the vibration of the second cable line 39b to the second object 32 in the same manner as the conventional reference system 30a.

<Embodiment of Method of Manufacturing Article>

A method of manufacturing an article according to an embodiment of the present invention is suitable for manufacturing an article such as a microdevice, for example a semiconductor device, or an element having a microstructure. This method of manufacturing an article according to this embodiment includes a step of forming a pattern on a substrate by using a lithography apparatus (an exposure apparatus, imprinting apparatus, drawing apparatus, or the like) including the above-described vibration reduction apparatus and a step of processing the substrate on which the pattern has been formed in the preceding step. The manufacturing method further includes other known steps (oxidation, film formation, deposition, doping, planarization, etching, resist removal, dicing, bonding, packaging, and the like).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-055615 filed Mar. 18, 2014, which is hereby incorporated by reference herein in its entirety.

What is claimed is:

1. A vibration reduction apparatus which reduces a vibration of a target object supported on a base, the apparatus comprising:
  a first object supported by a first elastic member on the base;
  a second object supported by a second elastic member on the first object;
  a detection unit including a sensor having a first electrode provided on the first object and a second electrode provided on the second object, and a processor configured to obtain a distance between the first electrode and the second electrode using the sensor;
  a first driving unit arranged between the base and the first object, and configured to drive the first object;
  a first control unit configured to control the first driving unit so as to make the distance between the first electrode and the second electrode constant based on a detection result by the detection unit;
  a second driving unit arranged between the base and the target object, and configured to drive the target object; and
  a second control unit configured to control the second driving unit so as to make a distance between the target object and the second object constant,
  wherein the second electrode and the processor are electrically connected to each other via the second elastic member.

2. The apparatus according to claim 1, wherein the second electrode and the processor are electrically connected to each other via the second elastic member, the first elastic member, and an elastically conductive member provided on a part of the first object.

3. The apparatus according to claim 1, wherein the first elastic member and the second elastic member are electrically connected to each other, and
  the second electrode and the processor are electrically connected to each other via the first elastic member and the second elastic member.

4. The apparatus according to claim 1, wherein the second electrode is provided on a surface of the second object on a side of the first object and formed by an electrically conductive film electrically connected to the second elastic member.

5. The apparatus according to claim 1, wherein the sensor includes a first probe having the first electrode and a second probe having the second electrode, and
  the second electrode is electrically connected to the second elastic member via an electrically conductive member provided on the second object.

6. The apparatus according to claim 1, wherein the detection unit includes one of an electrostatic capacitance sensor and an eddy current displacement sensor.

7. A vibration reduction apparatus which reduces a vibration of a target object supported on a base, the apparatus comprising:
  a first object supported by a first elastic member on the base;
  a second object supported by a second elastic member on the first object;
  a detection unit including a sensor having a first electrode provided on the first object and a second electrode provided on the second object, and a processor configured to obtain a distance between the first electrode and the second electrode using the sensor;
  a first driving unit arranged between the base and the first object, and configured to drive the first object;
  a first control unit configured to control the first driving unit so as to make the distance between the first electrode and the second electrode constant based on a detection result by the detection unit;
  a second driving unit arranged between the base and the target object, and configured to drive the target object; and
  a second control unit configured to control the second driving unit so as to make a distance between the target object and the second object constant,
  wherein the second electrode and the processor are electrically connected to each other via a cable line, and
  the cable line includes a fixing portion fixed on the first object without being electrically connected to the first object.

8. The apparatus according to claim 7, wherein the cable line is fixed on the first object such that a length between the fixing portion and a connecting portion connected to the second electrode is longer than a distance between the first object and the second object.

9. The apparatus according to claim 7, wherein the cable line is fixed on the first object to warp in a region between the second electrode and the first object.

10. A lithography apparatus which forms a pattern on a substrate, the apparatus comprising:
  a unit configured to form a pattern on the substrate; and
  a vibration reduction apparatus which reduces a vibration of a target object supported on a base, the apparatus comprising:
  a first object supported by a first elastic member on the base;
  a second object supported by a second elastic member on the first object;
  a detection unit including a sensor having a first electrode provided on the first object and a second electrode provided on the second object, and a processor configured to obtain a distance between the first electrode and the second electrode using the sensor;

a first driving unit arranged between the base and the first object, and configured to drive the first object;
a first control unit configured to control the first driving unit so as to make the distance between the first electrode and the second electrode constant based on a detection result by the detection unit;
a second driving unit arranged between the base and the target object, and configured to drive the target object; and
a second control unit configured to control the second driving unit so as to make a distance between the target object and the second object constant,
wherein the second electrode and the processor are electrically connected to each other via the second elastic member,
wherein the unit configured to form the pattern is mounted on the target object of the vibration reduction apparatus.

11. A method of manufacturing an article, the method comprising:
forming a pattern on a substrate using a lithography apparatus; and
processing the substrate, on which the pattern has been formed, to manufacture the article,
wherein the lithography apparatus forms the pattern on the substrate and includes:
a unit configured to form a pattern on the substrate; and
a vibration reduction apparatus having a target object on which the unit is mounted,
wherein the vibration reduction apparatus which reduces a vibration of the target object supported on a base, the apparatus comprising:
a first object supported by a first elastic member on the base;
a second object supported by a second elastic member on the first object;
a detection unit including a sensor having a first electrode provided on the first object and a second electrode provided on the second object, and a processor configured to obtain a distance between the first electrode and the second electrode using the sensor;
a first driving unit arranged between the base and the first object, and configured to drive the first object;
a first control unit configured to control the first driving unit to make the distance between the first electrode and the second electrode constant based on a detection result by the detection unit;
a second driving unit arranged between the base and the target object, and configured to drive the target object; and
a second control unit configured to control the second driving unit so as to make a distance between the target object and the second object constant,
wherein the second electrode and the processor are electrically connected to each other via the second elastic member.

12. An apparatus which controls a vibration of a target object supported on a base, the apparatus comprising:
a first object;
a first elastic member which supports the first object on the base;
a second object;
a second elastic member which supports the second object on the first object;
a detection unit including a first electrode provided on the first object and a second electrode provided on the second object, and configured to perform detection for obtaining a distance between the first electrode and the second electrode;
a first driving unit configured to drive the first object;
a first control unit configured to control the first driving unit so as to make the distance approach a target distance based on the obtained distance;
a second driving unit configured to drive the target object; and
a second control unit configured to control the second driving unit based on a distance between the target object and the second object,
wherein the second electrode and the first control unit are electrically connected to each other via the second elastic member.

13. A lithography apparatus which forms a pattern on a substrate, the apparatus comprising:
a unit configured to form a pattern on the substrate; and
an apparatus, defined in claim 12, which controls a vibration of a target object on which the unit configured to form the pattern is mounted.

14. A method of manufacturing an article, the method comprising steps of:
forming a pattern on a substrate using a lithography apparatus defined in claim 13; and;
processing the substrate, on which the pattern has been formed, to manufacture the article.

15. An apparatus which controls a vibration of a target object supported on a base, the apparatus comprising:
a first object;
a first elastic member which supports the first object on the base;
a second object;
a second elastic member which supports the second object on the first object;
a detection unit including a first electrode provided on the first object and a second electrode provided on the second object, and configured to perform detection for obtaining a distance between the first electrode and the second electrode;
a first driving unit configured to drive the first object;
a first control unit configured to control the first driving unit so as to make the distance approach a target distance based on the obtained distance;
a second driving unit configured to drive the target object; and
a second control unit configured to control the second driving unit based on a distance between the target object and the second object,
wherein the second electrode and the first control unit are electrically connected to each other via a cable line, and
the cable line is fixed on the first object without being electrically connected to the first object.

16. A lithography apparatus which forms a pattern on a substrate, the apparatus comprising:
a unit configured to form a pattern on the substrate; and
an apparatus, defined in claim 15, which controls a vibration of a target object on which the unit configured to form the pattern is mounted.

17. A method of manufacturing an article, the method comprising steps of:
forming a pattern on a substrate using a lithography apparatus defined in claim 16; and;
processing the substrate, on which the pattern has been formed, to manufacture the article.

18. An apparatus comprising:
a first object;

a first elastic member which supports the first object on the base;

a second object;

a second elastic member which supports the second object on the first object;

a detection unit including a first electrode provided on the first object and a second electrode provided on the second object, and configured to perform detection for obtaining a distance between the first electrode and the second electrode;

a first driving unit configured to drive the first object;

a first control unit configured to control the first driving unit so as to make the distance approach a target distance based on the obtained distance;

wherein the second electrode and the first control unit are electrically connected to each other via the second elastic member.

19. An apparatus comprising:

a first object;

a first elastic member which supports the first object on the base;

a second object;

a second elastic member which supports the second object on the first object;

a detection unit including a first electrode provided on the first object and a second electrode provided on the second object, and configured to perform detection for obtaining a distance between the first electrode and the second electrode;

a first driving unit configured to drive the first object;

a first control unit configured to control the first driving unit so as to make the distance approach a target distance based on the obtained distance;

wherein the second electrode and the first control unit are electrically connected to each other via a cable line, and the cable line is fixed on the first object without being electrically connected to the first object.

\* \* \* \* \*